United States Patent [19]
Sung

[11] Patent Number: 5,792,690
[45] Date of Patent: Aug. 11, 1998

[54] METHOD OF FABRICATING A DRAM CELL WITH AN AREA EQUAL TO FOUR TIMES THE USED MINIMUM FEATURE

[75] Inventor: Jan Mye Sung, Yang-May, Taiwan

[73] Assignee: Vanguard International Semiconductor Corporation, Hsin-Chu, Taiwan

[21] Appl. No.: 856,777

[22] Filed: May 15, 1997

[51] Int. Cl.[6] ............................................. H01L 21/8242
[52] U.S. Cl. .................................... 438/253; 438/268
[58] Field of Search .............................. 438/238, 239, 438/253, 268; 257/306

[56] References Cited

U.S. PATENT DOCUMENTS

| | | | |
|---|---|---|---|
| 5,214,603 | 5/1993 | Dhong et al. | 365/207 |
| 5,336,629 | 8/1994 | Dhong et al. | 437/52 |
| 5,376,575 | 12/1994 | Kim et al. | 438/239 |
| 5,432,739 | 7/1995 | Pein | 365/185 |
| 5,451,538 | 9/1995 | Fitch et al. | 438/253 |
| 5,691,550 | 11/1997 | Kohyama | 257/306 |

*Primary Examiner*—Joni Chang
*Attorney, Agent, or Firm*—George O. Saile; Stephen B. Ackerman

[57] ABSTRACT

A DRAM cell structure, and a fabrication process to create the DRAM cell structure, has been developed. The area consumed by the DRAM cell structure is reduced by vertically aligning a polysilicon word line structure, to an underlying bit line structure, and to an overlying capacitor structure. The process features creating a narrow hole in a polysilicon word line structure, and in overlying and underlying insulator layers. The narrow hole, when filled with single crystalline silicon, connects the polysilicon word line structure to an underlying bit line structure, as well as connecting to an overlying capacitor structure.

23 Claims, 7 Drawing Sheets

METHOD OF FABRICATING A DRAM CELL WITH AN AREA EQUAL TO FOUR TIMES THE USED MINIMUM FEATURE

BACKGROUND OF THE INVENTION (1) Field of the Invention

The present invention relates to a process used to fabricate dynamic random access memory, (DRAM), devices, and more specifically to a fabrication process in which the area of the DRAM cell is reduced by stacking the capacitor structure over the access transistor.

(2) Description of the Prior Art

In order to satisfy demands for high density DRAM semiconductor chips, micro-miniaturization, or the use of sub-micron features, used for DRAM designs, are employed. The attainment of micro-miniaturazation, or sub-micron features, has been mainly accomplished by advances in specific semiconductor fabrication disciplines, such as photolithography and dry etching. The use of more sophisticated exposure cameras, as well as the use of more sensitive photoresist materials, have allowed sub-micron images to be created in photoresist layers. In addition the development of more advanced dry etching tools and etch recipes, have allowed the sub-micron images in overlying photoresist layers to be successfully transferred to underlying materials, used in the creation of advanced semiconductor devices.

However to achieve DRAM densities of 256 megabits, or greater, new designs may be needed. Currently the area needed for a DRAM cell is equal to about eight times the minimum feature used, sometimes referred to as $8F^2$ The creation of DRAM devices, with an area only four times the minimum used feature, $4F^2$, is limited by two basic elements in the DRAM cell, the word line transistor and the storage capacitor. These two elements can not use the same space on the semiconductor chip, if $4F^2$ is to be realized. To achieve a DRAM area of $4F^2$ these two elements have to be aligned vertically.

This invention will describe a fabrication process for a DRAM cell, in which $4F^2$ is achieved by vertically aligning the polysilicon capacitor structure and the gate polysilicon structure, while using an underlying bit line, embedded in the device isolation insulator. Prior art, such as Dhong, et al, describe a method for forming a folded bit line DRAM cell, however that process differs from the present invention in many key areas, such as their use of polysilicon filled trenches, as capacitors.

SUMMARY OF THE INVENTION

It as an object of this invention to create a DRAM cell, consuming an area equal to about four times the minimum design feature.

It is another object of this invention to create a DRAM cell in which the word line and storage capacitor structure, are vertically aligned, occupying the same semiconductor substrate space.

It is still another object of this invention to use an bit line, embedded in an isolation insulator layer.

It is still yet another object of this invention to use a metal silicide spacer, on the sides of the polysilicon gate structure, to reduce gate resistance.

In accordance with the present invention a method for creating a DRAM cell, with a reduced area, by vertically aligning a polysilicon capacitor, and polysilicon gate structure, as well as using embedded bit lines, has been developed. Recessed regions, in a first insulator layer, are partially filled with metal silicide, followed by the deposition of an overlying, second insulator layer, resulting in embedded, metal silicide bit lines. A deposition of a doped, first polysilicon layer, is followed by patterning, using photolithographic and dry etching procedures, creating the polysilicon word line structure. A thin metal silicide spacer is next formed on the sides of the polysilicon word line structure, followed by the deposition of a third insulator layer. Photolithographic and dry etching procedures are again employed to create a narrow device hole in the third insulator layer, in the polysilicon wordline structure, and in the second insulator layer, exposing an embedded bit line region. A gate insulator layer is thermally grown on the sides of the polysilicon wordline structure, exposed in the narrow device hole, followed by the deposition of a first amorphous silicon layer, and a dry etch procedure, used to leave the first amorphous silicon layer, only interfacing the gate insulator layer, on the sides of the polysilicon word line structure. An intrinsic, second polysilicon layer is next deposited, followed by a zero degree ion implantation procedure, resulting in N type doping of the second polysilicon layer in a region directly overlying the embedded bit line region, in the bottom of the narrow device hole, and also creating an N type region in the second polysilicon layer, overlying the third insulator layer, in a region not used for the device hole. A second amorphous silicon layer is then deposited, completely filling the narrow device hole. An anneal is next performed resulting in recrystallization of the amorphous silicon, and the second polysilicon layer, and also creating an N type source and drain region, interfacing the embedded bit line region, at the bottom of the narrow device hole, and an N type source and drain region at the top of the silicon filled, narrow device hole. The recrystallized silicon interfacing the gate insulator layer, in the center of the silicon filled, narrow device hole, used for the channel region, remains undoped. A thick, doped, third polysilicon layer is next deposited and patterned to form the storage node for a capacitor structure, directly overlying the N type source and drain region, in the top of the silicon filled device hole. A capacitor dielectric layer is deposited, followed by the deposition of a fourth polysiliocn layer. Patterning of the fourth polysilicon layer is used to create the cell plate of the capacitor structure, for the DRAM cell.

BRIEF DESCRIPTION OF THE DRAWINGS

The object and other advantages of this invention are best described in the preferred embodiment with reference to the drawings that include:

FIGS. 3b, 4b, and 10b, which schematically in cross-sectional style, show key fabrication stages for the DRAM cell, using a cross sections that are 90 degrees different then the cross sections shown for FIGS. 1a, 2a, 3a, 4a, 5a, 6a, 7a, 8a, 9a, and 10a.

DESCRIPTION OF THE PREFERRED EMBODIMENTS

The method of creating a DRAM cell with a reduced area, resulting from vertically aligning a polysilicon capacitor structure, and a polysilicon gate structure, will now be described in detail. The DRAM cell in this invention has been described as a N channel, device, however this invention can also be used for P channel devices, by simply using P type ion implantation procedures to doped the refilled silicon in the narrow device hole.

Figure 1A:
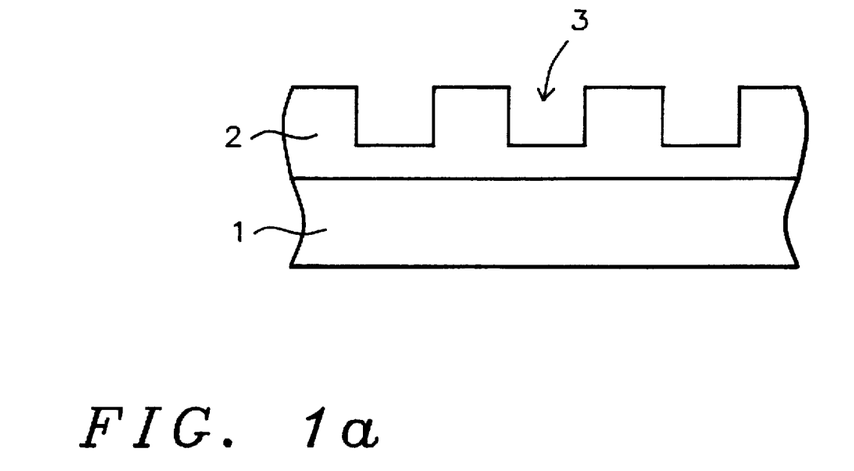
FIGS. 1a, 2a, 3a, 4a, 5a, 6a, 7a, 8a, 9a, and 10a, which schematically, in cross sectional style, describe key stages of fabrication used to create the DRAM cell, shown in this invention.

A P type, semiconductor substrate, 1, comprised of silicon having a <100> crystallographic orientation, is used. A first insulator layer, of silicon oxide, 2, is obtained via thermal oxidation of semiconductor substrate, 1, in an oxygen—steam ambient, at a temperature between about 950° to 1100° C., to a thickness between about 4500 to 5500 Angstroms. Patterning, using conventional photolithographic and dry etching procedures, using $CHF_3$ as an etchant, are used to create trench regions, 3, in silicon oxide layer, 2. Trench regions, 3, schematically shown in FIG. 1a, are recessed between about 3500 to 4500 Angstroms, below the top surface of silicon oxide layer, 2. The photoresist pattern, used for defining recessed region, 3, is removed via plasma oxygen ashing.

Figure 2A:
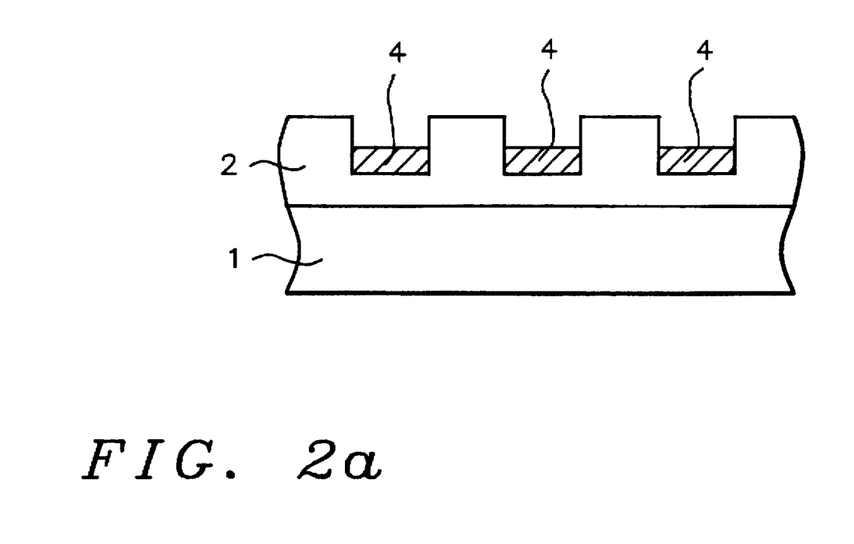

A conductive layer is next deposited, followed by anisotropic, dry etching, using $Cl_2$ as an etchant, to create a bit line, 4, in trench region, 3. This is schematically shown in FIG. 2a. The conductive layer can be tungsten, deposited using low pressure chemical vapor deposition, (LPCVD), procedures, at a temperature between about 300° to 600° C., to a thickness between about 2000 to 4000 Angstroms, using tungsten hexafluoride as a source. The conductive layer can also be tungsten silicide, again obtained via LPCVD procedures, at a temperature between about 300° to 600° C., to a thickness between about 2000 to 4000 Angstroms, using tungsten hexafluoride and silane, as a source. The anisotropic dry etching procedure removes the conductive layer from the top surface of silicon oxide layer, 2, while also recessing the conductive layer, between about 1000 to 2000 Angstroms below the top surface of silicon oxide layer, 2, resulting in recessed bit line structures, 4.

Figure 3A:
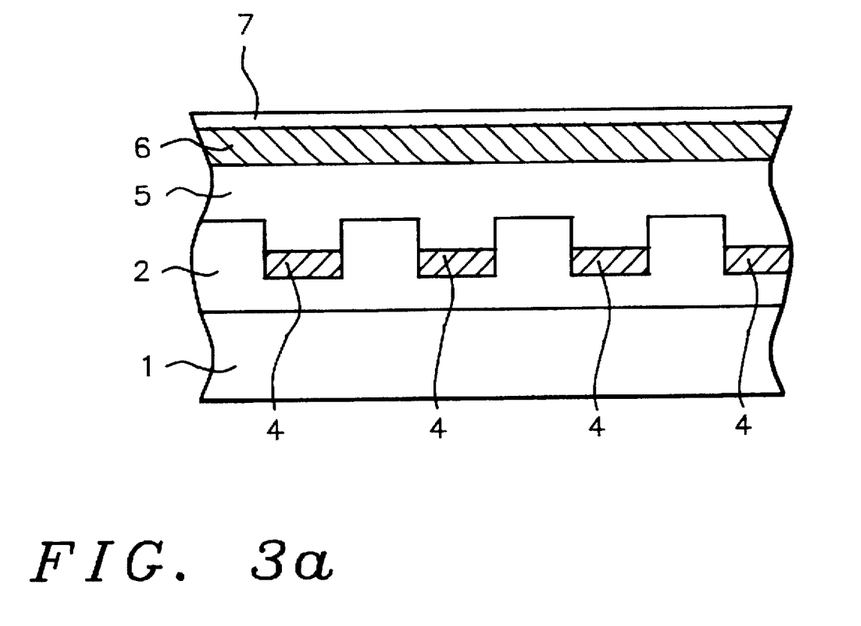
Figure 3B:
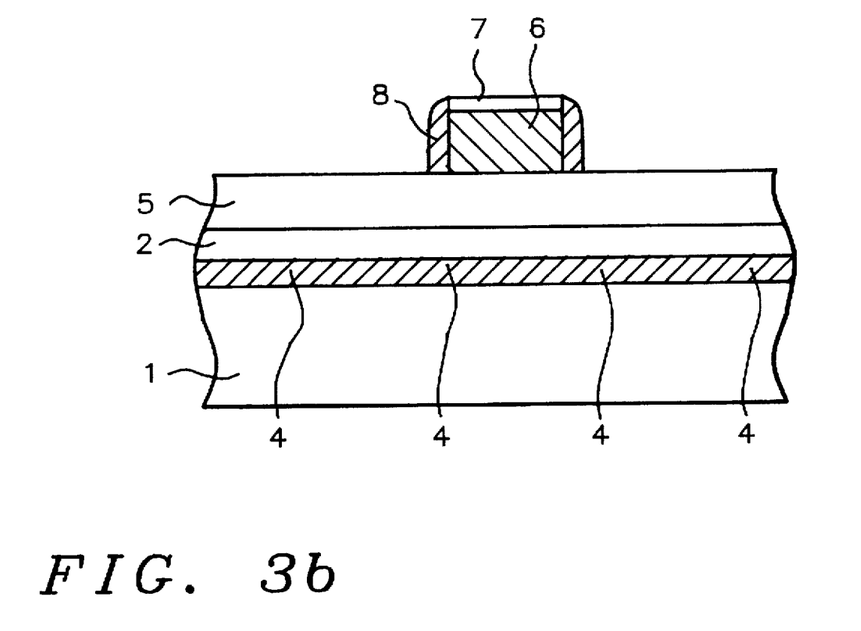

A second silicon oxide layer, 5, is next deposited using either LPCVD or plasma enhanced chemical vapor deposition, (PECVD), procedures, at a temperature between about 300° to 600° C., to a thickness between about 500 to 1500 Angstroms, using tetraethylorthosilicate, (TEOS), as a source. This is schematically shown in FIG. 3a. Silicon oxide layer, 5, is planarized, using chemical mechanical polishing, (CMP), to create a smooth top surface, resulting in the embedding of bit line structures, 4. A first polysilicon layer, 6, is next deposited using LPCVD procedures, at a temperature between about 500° to 650° C., to a thickness between about 3000 to 4000 Angstroms, using in situ doping procedures via the addition of arsine or phosphine to a silane ambient. Next a thin silicon oxide layer, 7, is thermally grown on the top surface of polysiliocn layer, 6. This is schematically shown in FIG. 3a. Patterning to create a word line structure is next accomplished using conventional photolithographic and anisotropic dry etching procedures, using $CHF_3$ as an etchant for silicon oxide layer, 7, and using $Cl_2$ as the etchant for polysilicon layer, 6. After photoresist removal using plasma oxygen ashing and careful wet cleans, tungsten spacers, 8, are formed on the exposed sides of polysilicon layer, 6, of the word line structure, to reduce word line resistance. This is schematically shown in FIG. 3b, using a cross-section 90° from the cross-section displayed in FIG. 3a. Tungsten spacers, 8, are formed by first depositing a layer of tungsten, using r.f sputtering procedures, to a thickness between about 500 to 1000 Angstroms. An anisotropic RIE procedure, using $SF_6$ as an etchant, is used to form tungsten spacers 8, on the sides of polysilicon word line structure, 6, schematically shown in FIG. 3b. Silicon oxide layer 7, protected the polysilicon word line structure 6, during the tungsten etch procedure.

Figure 4A:
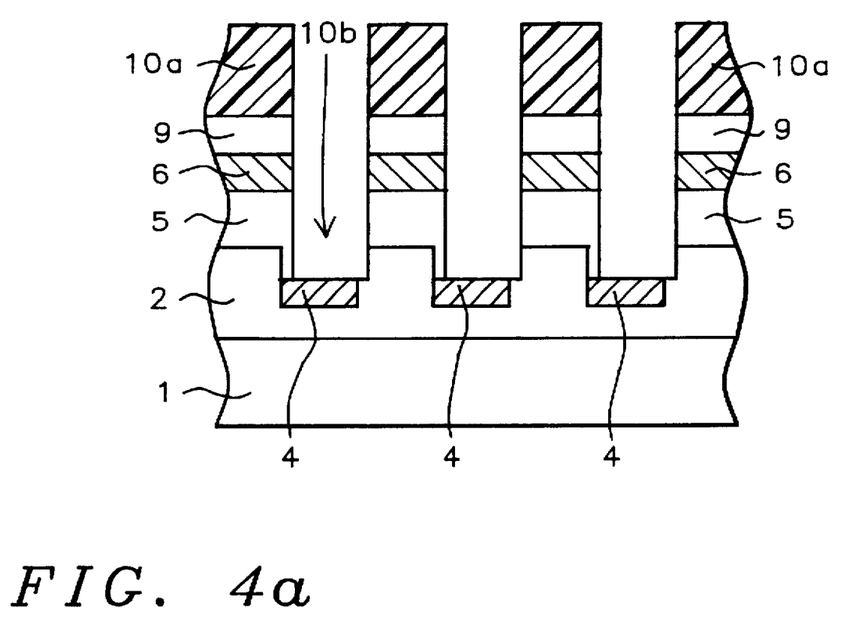
Figure 4B:
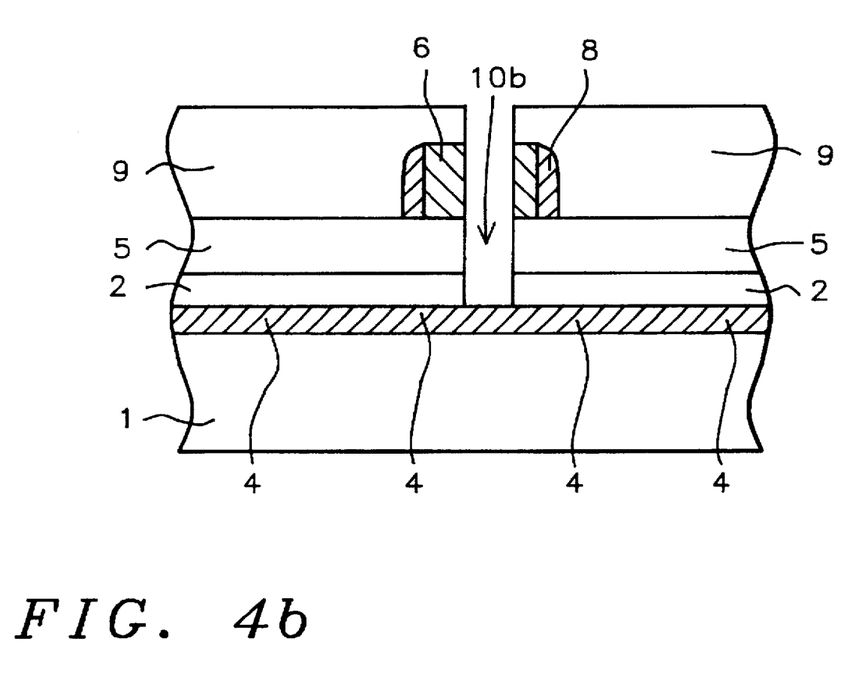

After a pre-clean, in a buffered hydrofluoric acid solution, removing thin silicon oxide layer, 7, a third silicon oxide layer, 9, is deposited using PECVD procedures, at a temperature between about 300° to 600° C., to a thickness between about 1000 to 2000 Angstroms, using tetraethylorthosilicate as a source. A critical patterning procedure is next used to create narrow device hole, 10b, shown schematically in FIG. 4a, and again in FIG. 4b, using a view 90° from the view used for FIG. 4a. First a photoresist shape, 10a, is created, with an opening between about 0.20 to 0.30 uM. An anisotropic dry etching procedure is then used to transfer the opening in photoresist shape, 10a, to the underlying materials, creating narrow device hole, 10b, with a diameter between about 0.20 to 0.30 uM. This is accomplished using $CHF_3$ as an etchant for silicon oxide layer, 9, $Cl_2$ as an etchant for polysilicon word line structure, 6, and $CHF_3$ as an etchant for silicon oxide layer, 5, and silicon oxide layer, 2. Endpoint for the dry etching procedure is reached when embedded bit line region, 4, is exposed at the bottom of narrow device hole, 10b. Photoresist shape, 10a, is removed using plasma oxygen ashing and careful wet cleans.

Figure 5A:
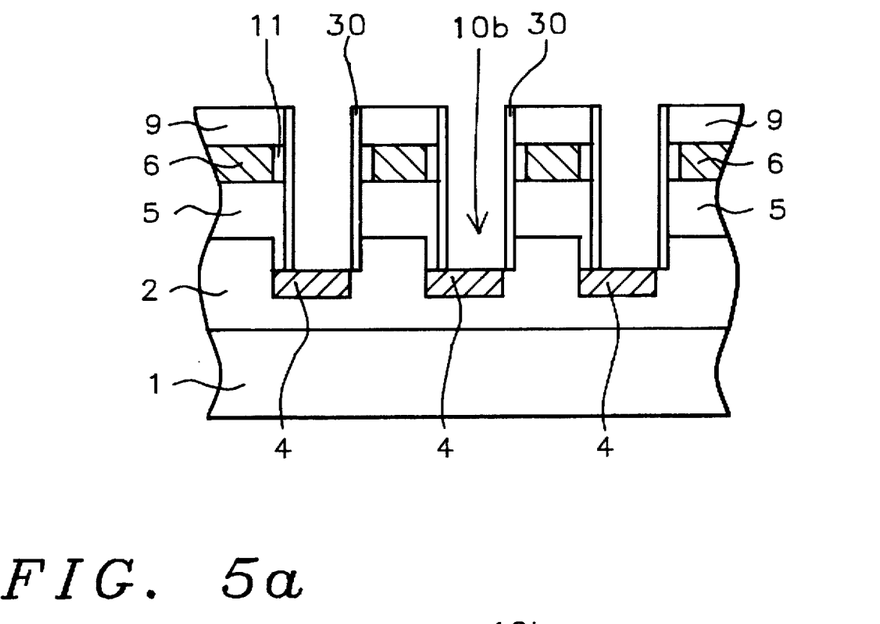
Figure 6A:
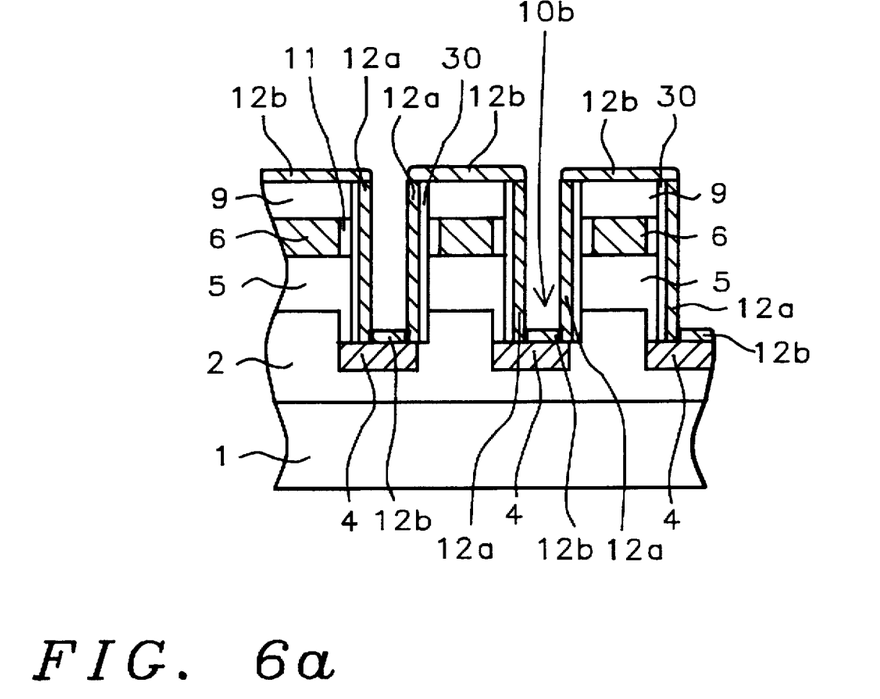

A gate insulator layer, 11, of silicon oxide, is thermally grown on the exposed sides of polysilicon word line structure, 6, to a thickness between about 70 to 120 Angstroms, at a temperature between about 900° to 950° C., in a dry oxygen ambient. A first amorphous silicon layer, 30, is next deposited intrinsically, using LPCVD procedures, at a temperature between about 500° to 550° C., to a thickness between 200 to 400 Angstroms. An anisotropic dry etch procedure, using $Cl_2$ as an etchant, is used to form amorphous silicon spacers, 30, on the sides of the narrow device hole, 10b. A post-clean in a buffered hydrofluoric acid solution removes any oxide that may have formed on the top surface of embedded bit line region, 2, during the gate insulator procedure. The result of these procedures are schematically displayed in FIG. 5a. An intrinsic, second polysilicon layer, 12a, is next deposited using LPCVD procedures, at a temperature between about 600° to 650° C., to a thickness between about 500 to 1000 Angstroms. An ion implantation procedure, using arsenic or phosphorous, is performed at an energy between about 50 to 100 KeV, at a dose between about 1E15 to 5E15 atoms/$cm^2$, using a zero degree implant angle. The result of the zero degree, ion implantation procedure, schematically shown in FIG. 6a, is to create N type regions, 12b, in intrinsic polysilicon layer, 12a, in regions exposed to the implant, while leaving intrinsic polysilicon layer, 12a, undoped, in regions not exposed to the implantation procedure, that is regions in which intrinsic polysilicon layer, 12a, resided on the sides on narrow device hole, 10b.

Figure 7A:
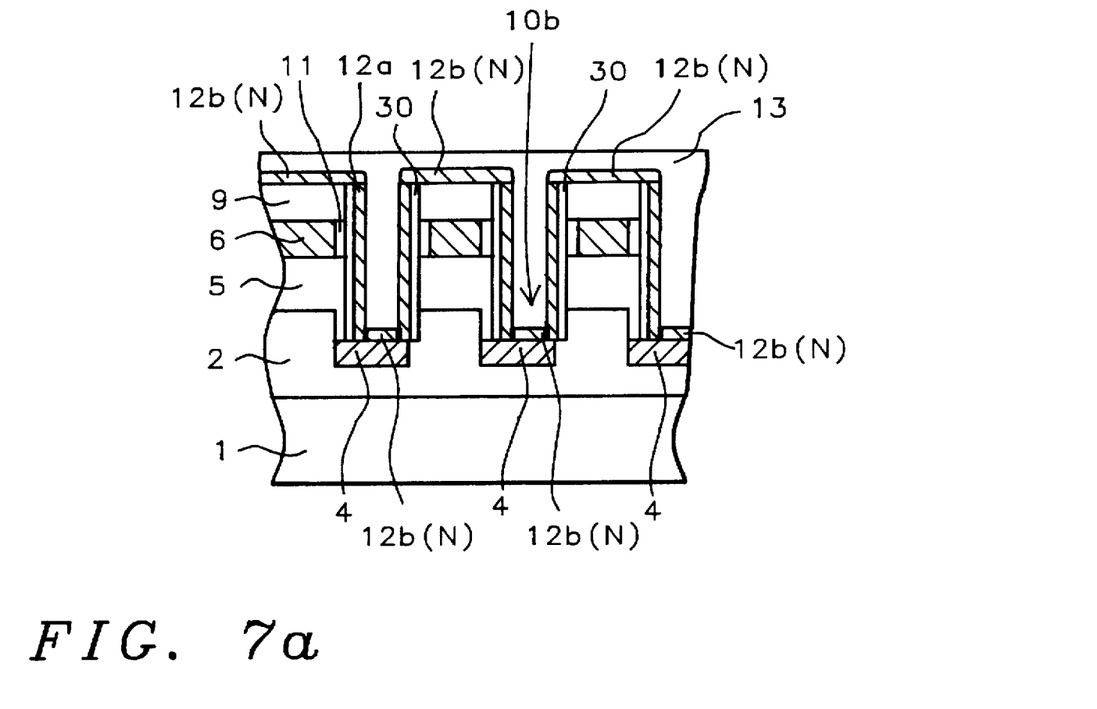

A second amorphous silicon layer, 13, is next deposited intrinsically, using LPCVD procedures, at a temperature between about 500° to 550° C., to a thickness between about 1500 to 2000 Angstroms, completely filling narrow device hole, 10b. This is shown schematically in FIG. 7a. A critical anneal procedure is next performed, at a temperature between about 600° to 800° C., in an $N_2$ ambient, for a time between about 2 to 8 hours, to recrystallize amorphous silicon layer, 13, polysilicon layer, 12a, and 12b, and amorphous silicon layer, 30, to single crystalline silicon layer, 14, residing in narrow device hole, 10b. The anneal procedure also distributed the N type dopants, in polysilicon regions, 12b, to create heavily doped, N+, source and drain region, 14a, overlying embedded bit line regions, 2, at the bottom of narrow device hole, 10b, and heavily doped, N+ source and drain region, 14d, at the top of the narrow device hole, 10b.

Figure 8A:
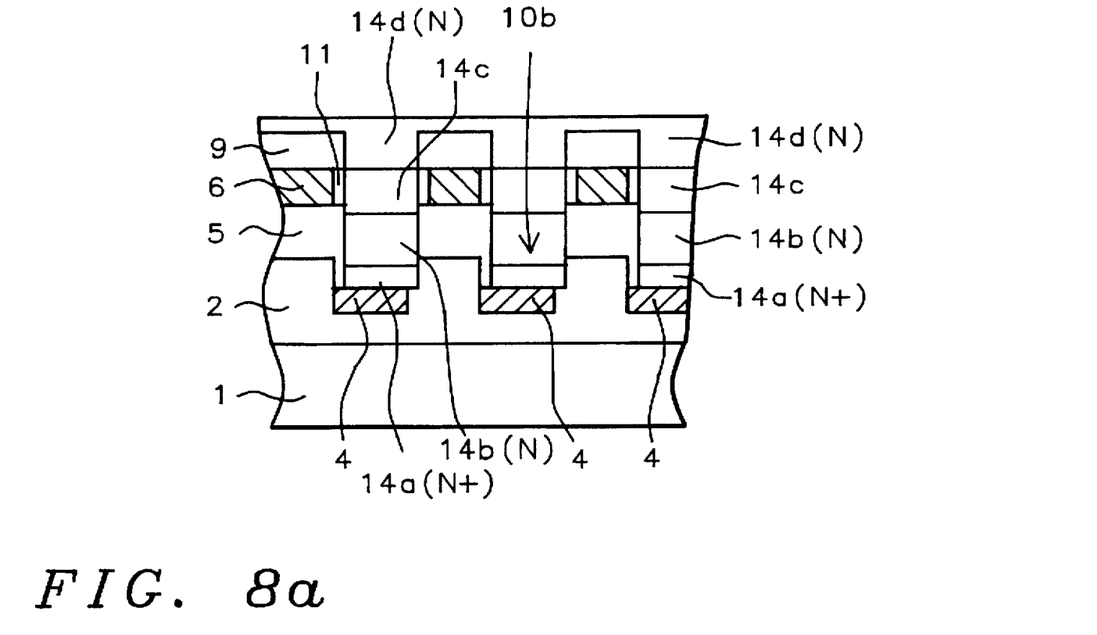

In addition a lightly doped, N type, source and drain region, 14b, is formed between heavily doped region, 14a, and an intrinsic silicon region, 14c, where intrinsic region, 14c, provides the channel region for the vertical transfer gate transistor. The channel length of the vertical transfer gate transistor is between about 0.30 to 0.40 uM. This is schematically shown in FIG. 8a.

Figure 9A:
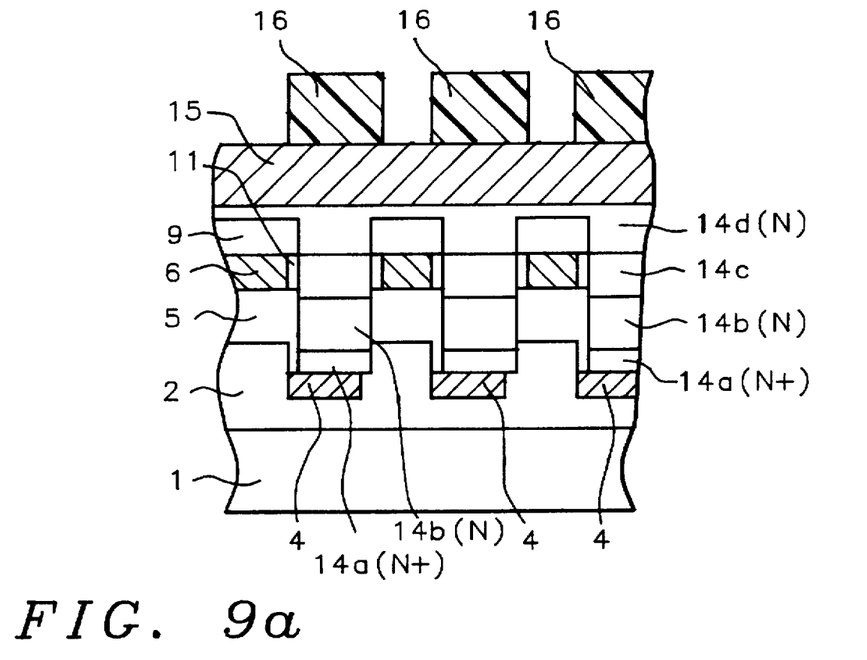
Figure 10A:
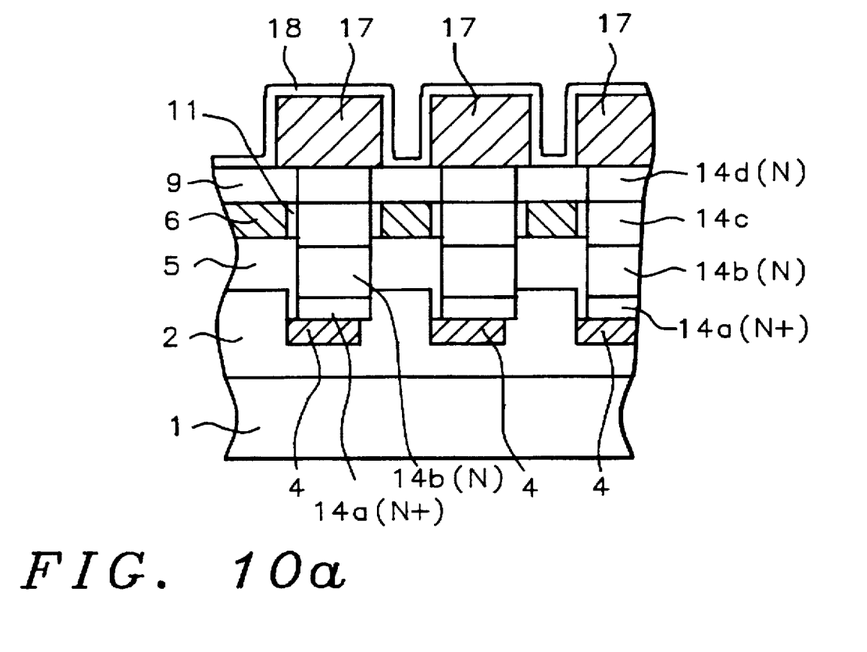
Figure 10B:
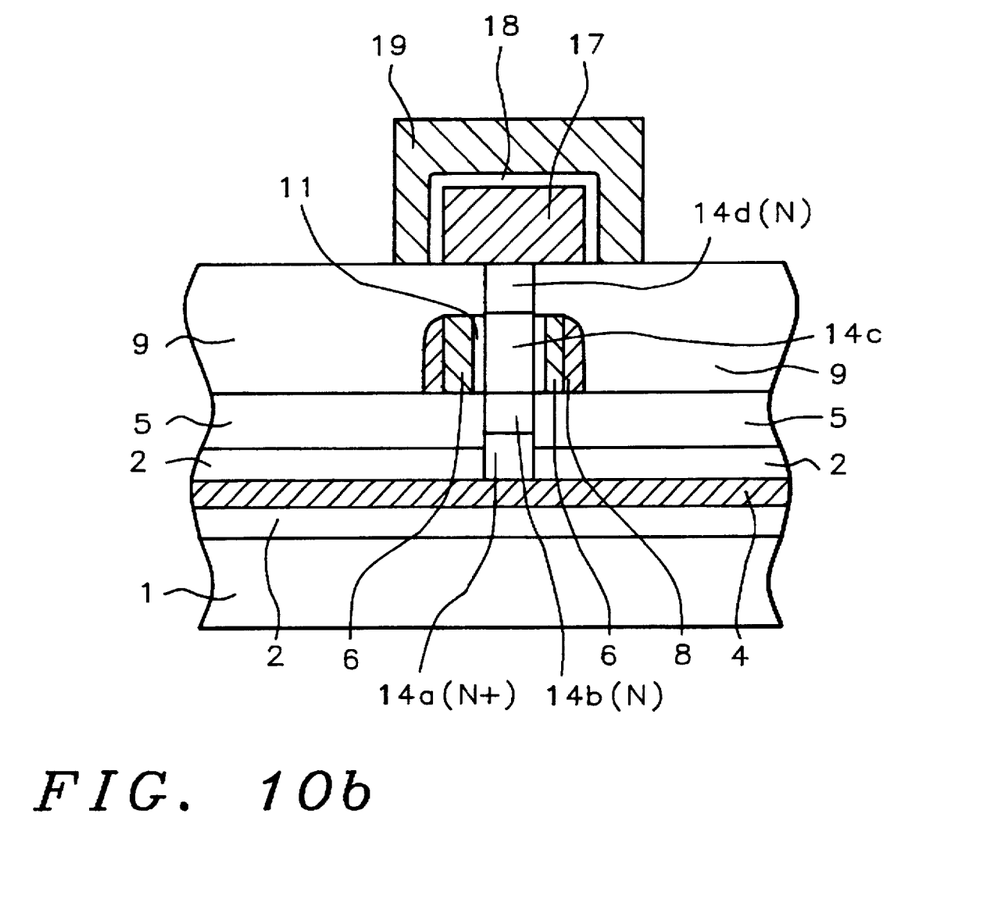

An in situ doped, third polysilicon layer, 15, is next deposited using LPCVD procedures, at a temperature between about 600° to 650° C., to a thickness between about 4000 to 8000 Angstroms, using silane, with the addition of either phosphine or arsine to provide the in situ doping. A photoresist shape, 16, is next formed to provide the desired shape for a subsequent storage node structure. This is shown schematically in FIG. 9a. Anisotropic dry etching, using Cl$_2$ as an etchant, is performed creating polysilicon storage node, 17, interfacing heavily doped source and drain region, 14d. This is shown in FIG. 10a. After removal of photoresist shape, 16, again using plasma oxygen ashing and careful wet cleans, a capacitor dielectric layer, 18, is deposited, and shown schematically in FIG. 10a. Capacitor dielectric layer, 18, can be a tantalum oxide layer, or an oxidized silicon nitride—silicon oxide, (ONO), composite, both at a silicon oxide equivalent thickness between about 10 to 100 Angstroms. A fourth polysilicon layer is then deposited, using LPCVD procedures, at a temperature between about 600° to 650° C., to a thickness between about 1000 to 3000 Angstroms. Conventional photolithographic and dry etching procedures, using Cl$_2$ as an etchant, are used to pattern the fourth polysilicon layer, creating cell plate, 19, schematically shown in FIG. 10b. The capacitor structure, comprised of cell plate, 19, capacitor dielectric layer, 18, and storage node, 17, is vertically aligned with the underlying transfer gate transistor, contacting heavily doped source and drain region, 14d. This is schematically shown in FIG. 10b, which is the view of the DRAM cell, taken 90° from the cross-sectional schematic of FIG. 10a. FIG. 10a, clearly shows the embedded bit line region, 2, contacting heavily doped source and drain region, 14a, in narrow device hole, 10b.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a dynamic random access memory DRAM cell, on a semiconductor substrate, with a capacitor structure and a word line transistor structure, vertically aligned, comprising the steps of:

growing a first insulator layer on said semiconductor substrate;

forming trenches in said first insulator layer;

depositing a first conductive layer;

anisotropic etching to remove said conductive layer from a top surface of said first insulator layer, and to recess said first conductive layer, in said trenches, forming recessed bit line structures;

depositing a second insulator layer on said recessed bit line structures, and on the top surface of said first insulator layer;

planarizing said second insulator layer;

depositing a first polysilicon layer on a top surface of said second insulator layer;

growing a silicon oxide layer on a top surface of said first polysilicon layer;

patterning of said silicon oxide layer and of said first polysilicon layer to create a polysilicon word line structure, on said second insulator layer;

forming metal or metal silicide spacers on sides of said polysilicon word line structure;

depositing a third insulator layer on said polysilicon word line structure, and on areas of said second insulator layer, not covered by said polysilicon word line structure;

patterning to create a narrow device hole in said third insulator layer, in said polysilicon word line structure, in said second insulator layer, and in said first insulator layer, exposing a top surface of said recessed bit line structures;

growing a gate insulator layer on sides of said polysilicon word line structure, exposed in said narrow device hole;

depositing a first amorphous silicon layer;

forming first amorphous silicon spacers on sides of said narrow device hole;

depositing a second polysilicon layer;

ion implanting first conductivity imparting dopants only into regions of said second polysilicon layer residing on a top surface of said third insulator layer, and residing on said recessed bit line structures, at a bottom of said narrow device hole, while not implanting into said second polysilicon layer, on the sides of said narrow device hole;

depositing a second amorphous silicon layer, completely filling said narrow device hole;

annealing to convert said second amorphous silicon layer, said second polysilicon layer, and said first amorphous silicon spacers, to single, crystalline silicon, in said narrow device hole, and redistributing said first conductivity imparting dopants, in said single crystalline silicon, in said narrow device hole, to form a first heavily doped source and drain region, overlying said recessed bit line structure, to form a lightly doped source and drain region, overlying said first heavily doped source and drain region, to form an intrinsic region of said single crystalline silicon, interfacing the sides of the polysilicon word line structure in the narrow device hole, and to form a second heavily doped source and drain region, overlying the intrinsic region of said single crystalline silicon, in said narrow device hole;

depositing a third polysilicon layer;

patterning of said third polysilicon layer to create a polysilicon storage node, overlying said second heavily doped source and drain region;

depositing a capacitor dielectric layer on said polysilicon storage node;

depositing a fourth polysilicon layer; and patterning of said fourth polysilicon layer to form cell plate, for said capacitor structure.

2. The method of claim 1, wherein said recessed bit line structures are comprised of tungsten, or tungsten silicide, at a thickness between about 2000 to 3000 Angstroms.

3. The method of claim 1, wherein said first polysilicon layer is deposited using in situ doped, low pressure chemical vapor deposition LPCVD procedures, at a temperature between about 600° to 650° C., to a thickness between about 3000 to 4000 Angstroms, adding phosphine, or arsine, to a silane ambient.

4. The method of claim 1, wherein said polysilicon word line structure is formed via anisotropic dry etching of said first polysilicon layer, using $Cl_2$ as an etchant.

5. The method of claim 1, wherein said narrow device hole is formed, with a diameter between about 0.20 to 0.30 uM, via anisotropic dry etching, using $CHF_3$ as an etchant for said third insulator layer, using $Cl_2$ as an etchant for said first polysilicon layer, and using $CHF_3$ as an etchant for said second insulator layer, and for said first insulator layer.

6. The method of claim 1, wherein said gate insulator layer is silicon oxide, thermally grown in a dry oxygen ambient, on the sides of said polysilicon word line structure, exposed in said narrow device hole, at a temperature between about 900° to 950° C., to a thickness between about 70 to 120 Angstroms.

7. The method of claim 1, wherein said first amorphous silicon layer is deposited, intrinsically, using LPCVD procedures, at a temperature between about 500° to 550° C., to a thickness between about 200 to 400 Angstroms.

8. The method of claim 1, wherein said second polysilicon layer is deposited intrinsically, using LPCVD procedures, at a temperature between about 600° to 650° C., to a thickness between about 500 to 1000 Angstroms.

9. The method of claim 1, wherein said first conductivity imparting dopant is arsenic or phosphorous, ion implanted at an energy between about 50 to 100 KeV, at a dose between about 1E15 to 5E15 atoms/$cm^2$, and implanted at a zero degree angle.

10. The method of claim 1, wherein said second amorphous silicon layer is deposited, intrinsically, using LPCVD procedures, at a temperature between about 500° to 550° C., to a thickness between about 1500 to 2000 Angstroms.

11. The method of claim 1, wherein said annealing, used to create recrystallized single crystalline silicon, and to redistribute said first conductivity imparting dopants, in said recrystallized single crystalline silicon, is performed at a temperature between about 600° to 800° C., in an $N_2$ ambient, for a time between about 2 to 8 hours.

12. A method for fabricating a DRAM cell, on a semiconductor substrate, in which an area of said DRAM cell is reduced by vertically aligning a polysilicon word line structure, to an underlying bit line structure, and vertically aligning said polysilicon word line structure, to an overlying capacitor structure, comprising the steps of:

growing a first silicon oxide layer on said semiconductor substrate;

forming trenches inside said first silicon oxide layer;

forming said bit line structure, in said trenches;

depositing a second silicon oxide layer on said bit line structure, and on top surface of said first silicon oxide layer;

planarizing said second silicon oxide layer;

depositing a doped, first polysilicon layer on said second silicon oxide layer;

growing a polysilicon oxide on a top surface of said first polysilicon layer;

patterning of said polysilicon oxide, and of said first polysilicon layer, to create said polysilicon word line structure, on said second silicon oxide layer;

forming metal silicide spacers on sides of said polysilicon word line structure;

removing said polysilicon oxide from a top surface of said polysilicon word line structure;

depositing a third silicon oxide layer on said polysilicon word line structure, and on areas of said second silicon oxide layer, not covered by said polysilicon word line structure;

creating a narrow device hole in said third silicon oxide layer, in a center of said polysilicon word line structure, in said second silicon oxide layer, and in said first silicon oxide layer, exposing top surface of bit line structure;

growing a gate oxide on sides of said polysilicon word line structure, exposed in said narrow device hole;

depositing an intrinsic, first amorphous silicon layer;

forming amorphous silicon spacers on the sides of said narrow device hole;

depositing an intrinsic, second polysilicon layer;

ion implanting first conductivity imparting dopants, using a zero degree implant angle, into regions of said second polysilicon layer residing on said bit line structure, in bottom of said narrow device hole, and into regions of said second polysilicon layer, residing on a top surface of said third silicon oxide layer, while not ion implanting said second polysilicon layer, which resides on the sides of said narrow device hole;

depositing an intrinsic, second amorphous silicon layer, completely filling said narrow device hole;

annealing to convert said second amorphous silicon layer, said second polysilicon layer, and said amorphous silicon spacers, to single crystalline silicon, in said narrow device hole, and redistributing said first conductivity imparting dopants, in said second polysilicon layer, to form a first heavily doped source and drain region, in said single crystalline silicon, overlying said bit line structure, to form a lightly doped source and drain region, in said single crystalline silicon, overlying said first heavily doped source and drain region, to form an intrinsic region, in said single crystalline silicon, overlying said lightly doped source and drain region, and interfacing said gate oxide layer, on the sides of said polysilicon word line structure, and to form a second heavily doped source and drain region, in said single crystalline silicon, overlying said intrinsic region;

depositing a doped, third polysilicon layer;

patterning of said third polysilicon layer to create a storage node structure, overlying said second heavily doped source and drain region;

depositing a capacitor dielectric layer on said storage node structure;

depositing a fourth polysilicon layer; and patterning of said fourth polysilicon layer to form cell plate structure, for said capacitor structure.

13. The method of claim 12, wherein said bit line structure is comprised of tungsten, or tungsten silicide, at a thickness between about 2000 to 3000 Angstroms.

14. The method of claim 12, wherein said first polysilicon layer is deposited, LPCVD procedures, at a temperature between about 600° to 650° C., to a thickness between about 3000 to 4000 Angstroms, using silane, and adding phosphine or arsine for in situ doping purposes.

15. The method of claim 12, wherein said polysilicon word line structure is formed via anisotropic etching of said first polysilicon layer, using $Cl_2$ as an etchant.

16. The method of claim 12, wherein said third silicon oxide layer is deposited using PECVD procedures, at a temperature between about 300 to 600° C., to a thickness between about 1000 to 2000 Angstroms, using tetraethylorthosilicate as a source.

17. The method of claim 12, wherein said narrow device hole is between about 0.20 to 0.30 uM in diameter, and formed via anisotropic dry etching, using $CHF_3$ as an etchant for said third silicon oxide layer, using $Cl_2$ as an etchant for said polysilicon word line structure, and using $CHF_3$ as an etchant for said second silicon oxide layer, and for said first silicon oxide layer.

18. The method of claim 12, wherein said gate oxide layer is formed via thermal oxidation of said polysilicon word line structure, in a dry oxygen ambient, at a temperature between about 900 to 950° C., to a thickness between about 70 to 120 Angstroms.

19. The method of claim 12, wherein said amorphous silicon spacers are formed by deposition of a first amorphous silicon layer, using LPCVD procedures, at a temperature between about 500° to 550° C., to a thickness between about 200 to 400 Angstroms, followed by an anisotropic dry etching procedure, using $Cl_2$ as an etchant.

20. The method of claim 12, wherein said second polysilicon layer is intrinsically deposited using LPCVD procedures, at a temperature between about 600° to 650° C., to a thickness between about 500 to 1000 Angstroms.

21. The method of claim 12, wherein said first conductivity imparting dopants are arsenic or phosphorous, ion implanted at a zero degree angle, and implanted at an energy between about 50 to 100 KeV, and at a dose between about 1E15 to 5E15 atoms/$cm^2$.

22. The method of claim 12, wherein said second amorphous silicon layer is deposited using LPCVD procedures, at a temperature between about 500° to 550° C., to a thickness between about 1500 to 2000 Angstroms.

23. The method of claim 12, wherein said anneal, used to create said single crystalline silicon in said narrow device hole, and to redistribute said first conductivity imparting dopants, in said single crystalline silicon, is performed at a temperature between about 600° to 800° C., in a $N_2$ ambient, for a time between about 2 to 8 hours.

* * * * *